US012800636B2

(12) United States Patent
Jiang et al.

(10) Patent No.: US 12,800,636 B2
(45) Date of Patent: Nov. 17, 2026

(54) LOW SCATTERING TURNTABLE FOR IMPROVING QUIET ZONE TEST PERFORMANCE AND QUIET ZONE TEST METHOD

(71) Applicant: CATARC AUTOMOTIVE TEST CENTER (TIANJIN) CO., LTD., Tianjin (CN)

(72) Inventors: Guokai Jiang, Tianjin (CN); Hua Zhou, Tianjin (CN); Kongjian Qin, Tianjin (CN); Bowei Zou, Tianjin (CN); Cheng Zhang, Tianjin (CN); Xiaodi Tian, Tianjin (CN); Xiucheng Li, Tianjin (CN); Jiaxu Feng, Tianjin (CN); Quan Wen, Tianjin (CN); Fujian He, Tianjin (CN); Shasha Tang, Tianjin (CN); Xiaolong Zhao, Tianjin (CN); Feiyan Wu, Tianjin (CN); Jinna Fan, Tianjin (CN); Jiaoyang Liu, Tianjin (CN); Zhiqiang Yang, Tianjin (CN); Dandan Wu, Tianjin (CN); Yu Wang, Tianjin (CN); Wenjun Sun, Tianjin (CN)

(73) Assignee: CATARC Automotive Test Center (Tianjin) Co., Ltd., Tianjin (CN)

( * ) Notice: Subject to any disclaimer, the term of this patent is extended or adjusted under 35 U.S.C. 154(b) by 161 days.

(21) Appl. No.: 18/963,727

(22) Filed: Nov. 28, 2024

(65) Prior Publication Data

US 2026/0050018 A1 Feb. 19, 2026

(30) Foreign Application Priority Data

Aug. 19, 2024 (CN) ........................ 202411136459.4

(51) Int. Cl.
*G01R 29/08* (2006.01)

(52) U.S. Cl.
CPC ................................ *G01R 29/0821* (2013.01)

(58) Field of Classification Search
CPC .............. G01R 29/0821; G01R 1/0408; G01R 29/0864; G01R 29/08; G01R 29/105;
(Continued)

(56) References Cited

U.S. PATENT DOCUMENTS 5,331,567 A * 7/1994 Gibbons .............. H01Q 17/008 703/3
5,492,749 A * 2/1996 Solves ................. H01Q 17/008 428/425.9
6,479,140 B1 * 11/2002 Takao ................ G01R 29/0821 428/317.9

FOREIGN PATENT DOCUMENTS

CN 102621162 A * 8/2012
CN 102710340 A * 10/2012 ............. H04B 17/29
(Continued)

OTHER PUBLICATIONS

CN 102621162 A—English translation (Year: 2012).*
(Continued)

*Primary Examiner* — Resha Desai
*Assistant Examiner* — Naomi M Wolford
(74) *Attorney, Agent, or Firm* — Ming Jiang; OPENPTO US LLC

(57) ABSTRACT

A low scattering turntable for improving quiet zone test performance and a quiet zone test method is provided, and relates to the technical field of quiet zone test. The low scattering turntable includes an L-shaped baffle, a rhombic inclined wedge supporting column, a bottom plate, a turntable base, a fixed block, a longitudinal rotating shaft and a transverse rotating shaft. In the disclosure, the rhombic inclined wedge supporting column is adopted, the sharp wedge diffraction and traveling wave scattering effects are reduced. Multi-layer side wave-absorbing materials layout
(Continued)

are used in the rhombic inclined wedge supporting column, which can effectively reduce electromagnetic reflection and scattering in a wide frequency range. By adding sawtooth wave-absorbing material to the edge of L-shaped baffle, the reflection intensity of electromagnetic wave is reduced and the overall wave-absorbing efficiency is improved. The oval bottom plate is adopted to reduce the measurement error.

8 Claims, 8 Drawing Sheets

(58) Field of Classification Search
CPC ..... Y02T 90/00; G01S 7/4086; H01Q 17/008; H01Q 15/0026; H01Q 15/0006; H01Q 17/007; H05K 9/0081; H05K 9/0088
See application file for complete search history.

(56) References Cited

FOREIGN PATENT DOCUMENTS

| | | | | |
|---|---|---|---|---|
| CN | 105021899 | A | * | 11/2015 |
| CN | 114487618 | A | | 5/2022 |
| CN | 217062530 | U | * | 7/2022 |

OTHER PUBLICATIONS

CN 105021899 A—English translation (Year: 2015).*
CN 114487618 A—English translation (Year: 2022).*
CN 217062530 U—Original and English translation (Year: 2022).*
CN 102710340 A—Original and English translation (Year: 2012).*

* cited by examiner

LOW SCATTERING TURNTABLE FOR IMPROVING QUIET ZONE TEST PERFORMANCE AND QUIET ZONE TEST METHOD

CROSS-REFERENCE TO RELATED APPLICATIONS

This application claims priority of Chinese Patent Application No. 202411136459.4, filed on Aug. 19, 2024, the content of which is hereby incorporated by reference.

TECHNICAL FIELD

The disclosure relates to the technical field of quiet zone test, in particular to a low scattering turntable for improving quiet zone test performance and a quiet zone test method.

BACKGROUND

In recent years, the Compact Antenna Test Range (CATR) has developed rapidly in our country. Compact Antenna Test Range technology refers to the far-field measurement of antenna parameters or radar target scattering characteristics at close range. At present, it is an important topic in the field of antenna and measurement field, and it is an effective method to solve the test difficulties of millimeter wave and other high-frequency antennas. The so-called quiet zone refers to the area that is least disturbed by stray waves in the microwave anechoic room, that is, in short-wave communication, an area dozens of kilometers away from the transmitting antenna until the ionosphere reflects the radio waves back to a previous area of the ground. It can be seen that the performance index of the quiet zone is very important for electromagnetic scattering measurement.

In the process of designing and testing the low scattering target, the metal bracket, as the target supporting structure, will inevitably reflect and scatter electromagnetic waves. Especially in the quiet zone test, the reflection performance of the turntable has a vital influence on the experimental results. The traditional turntable design mainly relies on experience and theoretical calculation, which fails to fully consider various factors in the actual environment, especially the influence of electromagnetic wave reflection in the quiet zone on the test results. Although some turntables have reduced unnecessary reflection to a certain extent, there are still some defects in their design, which will affect the accuracy of the quiet zone test results. Therefore, how to reduce the influence of supporting structure on electromagnetic scattering measurement has become an urgent problem.

In the prior art, the optimization of the bracket shape mainly focuses on the inclination angle and cross-sectional shape. Although optimizing the inclination angle and cross-sectional shape can reduce the reflection and scattering of electromagnetic waves to a certain extent, its effect is limited, especially in practical applications, because of the complexity of environmental conditions, it is difficult to achieve the best effect by optimizing a single parameter. In traditional design, wave-absorbing materials are rarely used, and even if they are used, they are mostly single-layer wave-absorbing materials, which have limited wave-absorbing effect and are difficult to significantly reduce electromagnetic wave reflection. The traditional design mainly focuses on the optimization of the electromagnetic scattering performance of the bracket, and often ignores the electromagnetic scattering of the supporting base, which leads to the influence on the accuracy of the actual test in practical application. In order to improve the accuracy of quiet zone test, it is necessary to improve the existing turntable design to further reduce the reflection level and unnecessary interference.

SUMMARY

In order to solve the above technical problems, the disclosure provides a low scattering turntable for improving the quiet zone test performance and a quiet zone test method. By optimizing the shape of the supporting column in the turntable and using the wave-absorbing material, the reflection level of the turntable is significantly reduced, and the accuracy of the quiet zone test is improved.

According to an aspect of the disclosure, a low scattering turntable for improving quiet zone test performance is provided, the low scattering turntable includes: an L-shaped baffle, a rhombic inclined wedge supporting column, a bottom plate, a turntable base, a fixed block, a longitudinal rotating shaft and a transverse rotating shaft; where:

- a bottom plate outer edge of the L-shaped baffle is provided with sawtooth wave-absorbing material;
- a bottom end of the rhombic inclined wedge supporting column is fixedly placed on the bottom plate, and a top end is fixedly connected with the fixed block; multi-layer wave-absorbing materials are arranged on a left side and a right side of the rhombic inclined wedge supporting column;
- a side surface of the fixed block is movably connected with the transverse rotating shaft, the transverse rotating shaft is movably connected with a side surface of the L-shaped baffle and the transverse rotating shaft drives the L-shaped baffle to rotate longitudinally by 360°;
- the longitudinal rotating shaft is movably connected below the bottom plate, the longitudinal rotating shaft is movably connected with the turntable base, the longitudinal rotating shaft drives the bottom plate and above components to rotate transversely by 360°.

Further, the sawtooth wave-absorbing material adopts a magnetic composite shielding layer.

Further, a height $h_z(x)$ of each sawtooth in the sawtooth wave-absorbing material at different horizontal positions is expressed as:

$$h_z(x) = A_z\left|\frac{2}{\pi}\arctan\left(\tan\left(\frac{\pi x}{\lambda}\right)\right)\right|;$$

where $A_Z$ represents an amplitude of the sawtooth; x represents a horizontal position of the sawtooth; λ represents a wavelength corresponding to a center frequency of a designed frequency band.

Further, the rhombic inclined wedge supporting column includes a plurality of sections of rhombic inclined wedges, and a calculation formula of a length $l_i$ of each of sections is:

$$l_i = l_0(1 + \alpha \times i);$$

where $l_0$ is a reference length and α is a length adjustment coefficient; i=1, 2, . . . , n, n is a total number of sections;

a calculation formula of an included angle $\theta_i$ between each of sections and a horizontal surface is:

$$\theta_i = \theta_0(1 + \beta \times i);$$

where $\theta_0$ is an initial inclination angle, and $\beta$ is an angle adjustment coefficient.

Further, thickness, dielectric constant and magnetic permeability of each layer wave-absorbing material of each of the multi-layer wave-absorbing materials are different; where a calculation formula of thickness of each layer wave-absorbing material is:

$$d_j = d_0\left(\cos\left(\frac{\pi \times j}{2m}\right) + 1\right);$$

where $d_0$ is an initial thickness, m is a total number of layers, and j is a j-th layer.

Further, a total number of layers each of the multi-layer wave-absorbing materials is three, where the first layer adopts a low scattering layer, the second layer adopts a carbon fiber layer, and the third layer adopts a magnetic composite shielding layer.

Further, the bottom plate is an oval bottom plate, and lengths of a long axis and a short axis of the oval bottom plate is obtained by electromagnetic simulation software, and a value of each of the lengths is multiple of the wavelength corresponding to the center frequency of the designed frequency band, and a reflection coefficient and scattering coefficient of the bottom plate are minimized.

Further, the bottom end of the rhombic inclined wedge supporting column is fixedly placed on a focus of the bottom plate.

According to another aspect of the disclosure, a quiet zone test method is provided, which includes: performing the quiet zone test by using the low scattering turntable for improving the quiet zone test performance.

The embodiment of the disclosure has the following technical effects.

Firstly, according to the disclosure, the multi-section adjustable rhombic inclined wedge supporting column is adopted, so that the single straight rod structure in the traditional turntable is obviously improved. Its advantage is that the multi-section design makes the supporting column have wider frequency band adaptability, can show excellent electromagnetic scattering performance in a wider frequency range, and is suitable for various measurement conditions. Through the gradual increase of the inclination angle of each section, the reflection direction of electromagnetic wave changes continuously during the propagation process, which significantly reduces the effects of sharp wedge diffraction and traveling wave scattering effect. The multi-section structure not only enhances the stability of the supporting column, but also has excellent mechanical deformation performance, which improves the accuracy and reliability of the overall test.

Secondly, the disclosure adopts the layout of multi-layer side wave-absorbing materials, which has obvious advantages in optimizing electromagnetic scattering. Its unique multi-layer design and wave-absorbing characteristics enable it to effectively reduce electromagnetic reflection and scattering in a wide frequency range. The thickness and arrangement of multi-layer wave-absorbing materials can be accurately adjusted by optimizing the design formula, so as to achieve the best wave-absorbing effect and significantly improve the overall performance. This can not only greatly reduce electromagnetic interference and improve measurement accuracy, but also have flexibility and adaptability, making it perform well in various application scenarios.

Thirdly, according to the disclosure, the sawtooth structure is added to the edge of the L-shaped baffle, and the sawtooth wave-absorbing material layout is sleeved outside the L-shaped baffle, so that the reflection intensity of electromagnetic waves can be significantly reduced, the overall absorbing efficiency can be improved, and the electromagnetic interference to the quiet zone can be reduced. At the same time, the combination of sawtooth structure and wave-absorbing materials makes the reflection and scattering paths of electromagnetic waves on multiple interfaces more complicated, which effectively increases the attenuation of electromagnetic waves and further improves the stealth and measurement accuracy.

Fourthly, according to the disclosure, an oval bottom plate structure is adopted, and the electromagnetic characteristics of the bottom plate can be optimized by accurately adjusting the ratio of the long axis to the short axis, so that the measurement error is obviously reduced, and the accuracy and reliability of the whole measurement system are improved. In addition, the design of oval bottom plate also has the advantages of strong structural stability and simple manufacturing process, which makes it more practical and efficient in practical application.

BRIEF DESCRIPTION OF THE DRAWINGS

In order to explain the specific embodiment of the disclosure or the technical scheme in the prior art more clearly, the drawings needed in the description of the specific embodiment or the prior art will be briefly introduced below. Obviously, the drawings in the following description are some embodiments of the disclosure, and other drawings can be obtained according to these drawings without creative work for ordinary skilled in the field.

DETAILED DESCRIPTION OF THE EMBODIMENTS

In order to make the purpose, technical scheme and advantages of the disclosure more clear, the technical scheme of the disclosure will be described clearly and completely below. Obviously, the described embodiment is only a part of the embodiment of the disclosure, not all of the embodiments. Based on the embodiments in the disclosure, all other embodiments obtained by ordinary skilled in the field without creative work belong to the scope of protection of the disclosure.

In order to overcome the influence of the supporting structure on the electromagnetic scattering measurement during the design and test of the low scattering target, the disclosure provides a low scattering turntable for improving quiet zone test performance and a quiet zone test method. The turntable designed by the disclosure replaces the structure of a single straight rod in the traditional turntable, and adopts multi-section adjustable rhombic inclined wedge supporting columns to improve incoming wave reflection, so that the coverage frequency band is widened, the adjustment is flexible, and the turntable has stable structure and mechanical properties. At the same time, considering the sharp wedge edge diffraction and traveling wave scattering, multi-layer wave-absorbing materials are introduced for the first time to adjust the scattering, and the absorption performance of the support for incoming waves is improved by setting different materials and percentage parameters to achieve multiple reflection and absorption. By introducing the L-shaped baffle with sawtooth shape, sawtooth shape wave-absorbing material, multi-section adjustable rhombic slope and oval bottom plate into the turntable structure, the electromagnetic reflection and scattering effects of the turntable are significantly reduced, thus improving the accuracy and reliability of electromagnetic scattering measurement.

Figure 1:
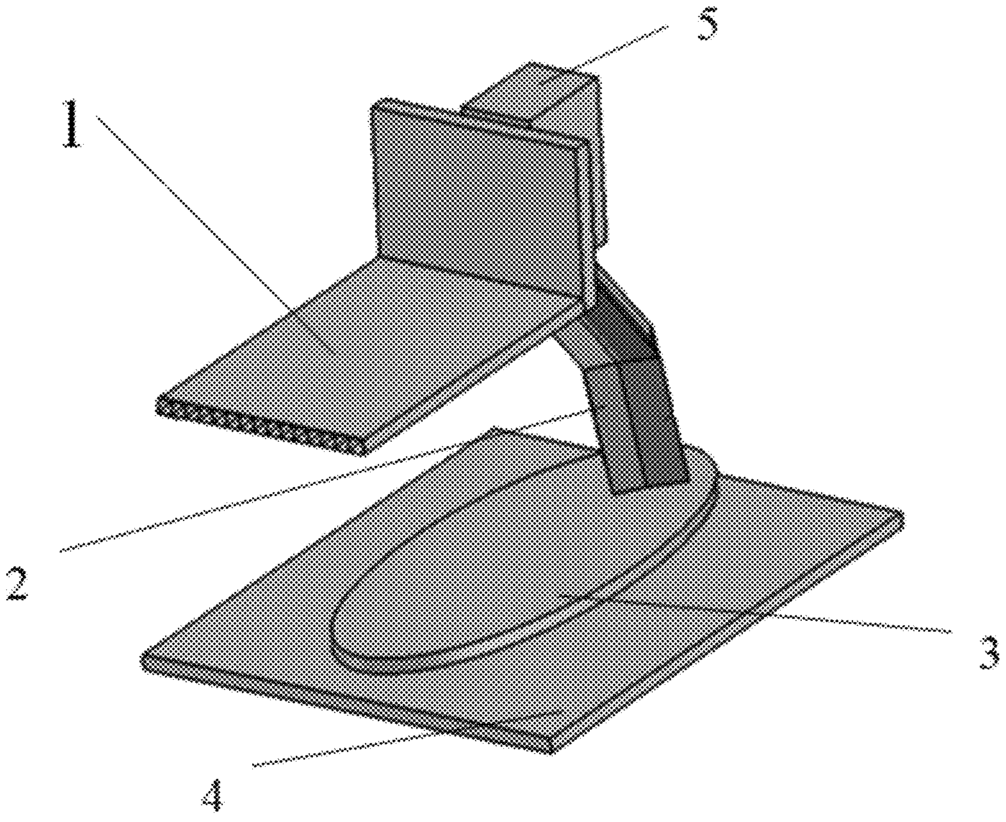
FIG. 1 is a front view of a low scattering turntable for improving quiet zone test performance according to an embodiment of the disclosure.
Figure 2:
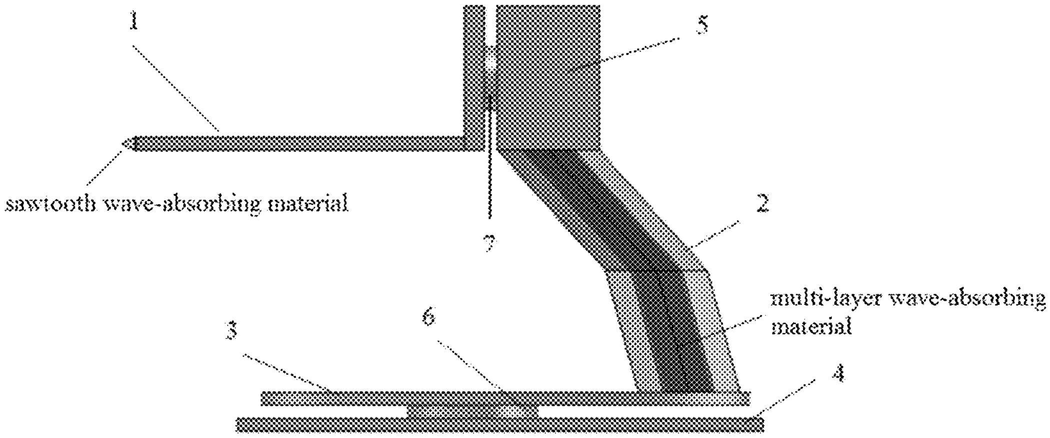
FIG. 2 is a right view of the low scattering turntable for improving quiet zone test performance according to an embodiment of the disclosure.
Figure 3:
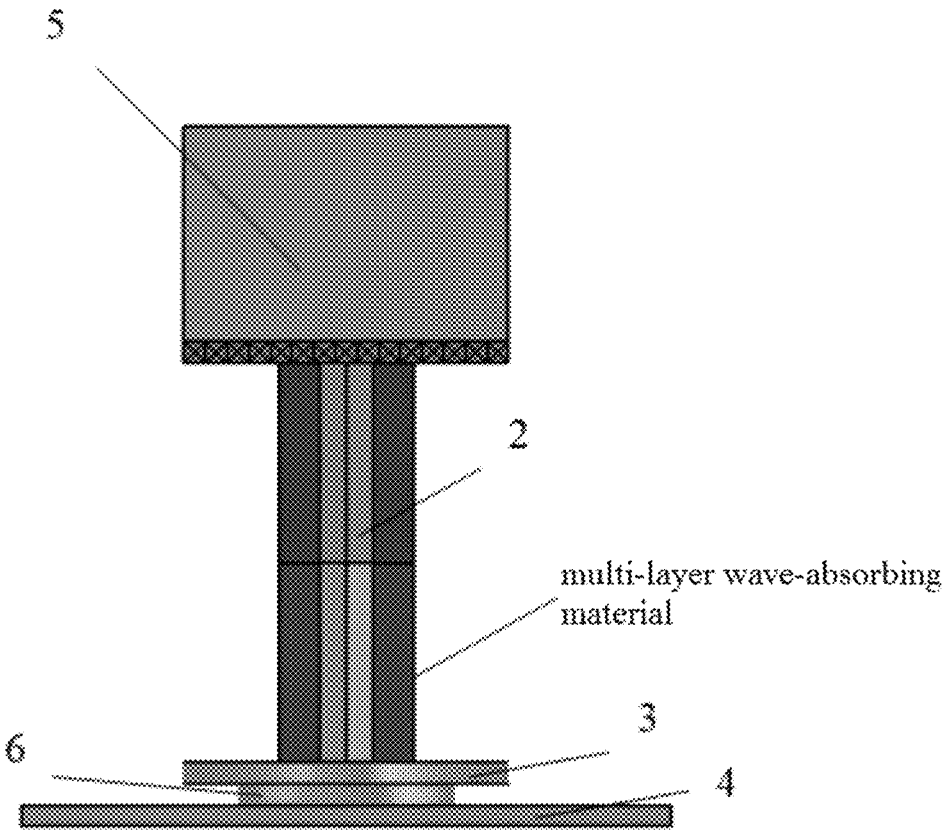
FIG. 3 is a rear view of the low scattering turntable for improving quiet zone test performance according to an embodiment of the disclosure.

The embodiment of the disclosure provides a low scattering turntable for improving quiet zone test performance, as shown in FIGS. 1 to 3, and the low scattering turntable includes: an L-shaped baffle 1, a rhombic inclined wedge supporting column 2, a bottom plate 3, a turntable base 4, a fixed block 5, a longitudinal rotating shaft 6 and a transverse rotating shaft 7.

A bottom plate outer edge of the L-shaped baffle 1 is provided with sawtooth wave-absorbing material.

a bottom end of the rhombic inclined wedge supporting column 2 is fixedly placed on the bottom plate 3, and a top end is fixedly connected with the fixed block 5; multi-layer wave-absorbing materials are arranged on a left side and a right side of the rhombic inclined wedge supporting column 2;

a side surface of the fixed block 5 is movably connected with the transverse rotating shaft 7, the transverse rotating shaft 7 is movably connected with a side surface of the L-shaped baffle 1 and the transverse rotating shaft 7 drives the L-shaped baffle 1 to rotate longitudinally by 360°;

the longitudinal rotating shaft 6 is movably connected below the bottom plate 3, the longitudinal rotating shaft 6 is movably connected with the turntable base 4, the longitudinal rotating shaft 6 drives the bottom plate 3 and above components to rotate transversely by 360°.

According to the embodiment of the disclosure, the bottom plate outer edge of the L-shaped baffle 1 is provided with sawtooth wave-absorbing materials, and the layout of the sawtooth wave-absorbing materials make electromagnetic waves reflect and scatter for many times when encountering the baffle, thus reducing the direct reflection of electromagnetic waves. The shape and structure of sawtooth wave-absorbing materials can be described by triangular wave function, and the shape and number of sawtooth are determined by the height and wavelength of sawtooth. The calculation formula of the height of each sawtooth at different horizontal positions is:

$$h_z(x) = A_z\left|\frac{2}{\pi}\arctan\left(\tan\left(\frac{\pi x}{\lambda}\right)\right)\right|;$$

Where $A_Z$ represents the amplitude of the sawtooth, and as an example, $A_z=0.347\lambda$; x represents the horizontal position of the sawtooth; $\lambda$ represents the wavelength corresponding to the center frequency of the designed low frequency band.

Sawtooth wave-absorbing materials are arranged at the key positions of the turntable, and MCS layer (magnetic composite shielding layer) is adopted as the sawtooth wave-absorbing materials, so that electromagnetic waves are absorbed in these areas and the intensity of electromagnetic waves reflected back to the quiet zone is reduced. The multi-layer layout of wave-absorbing materials can be optimized by specific functions, and the best wave-absorbing effect can be achieved.

Figure 4:
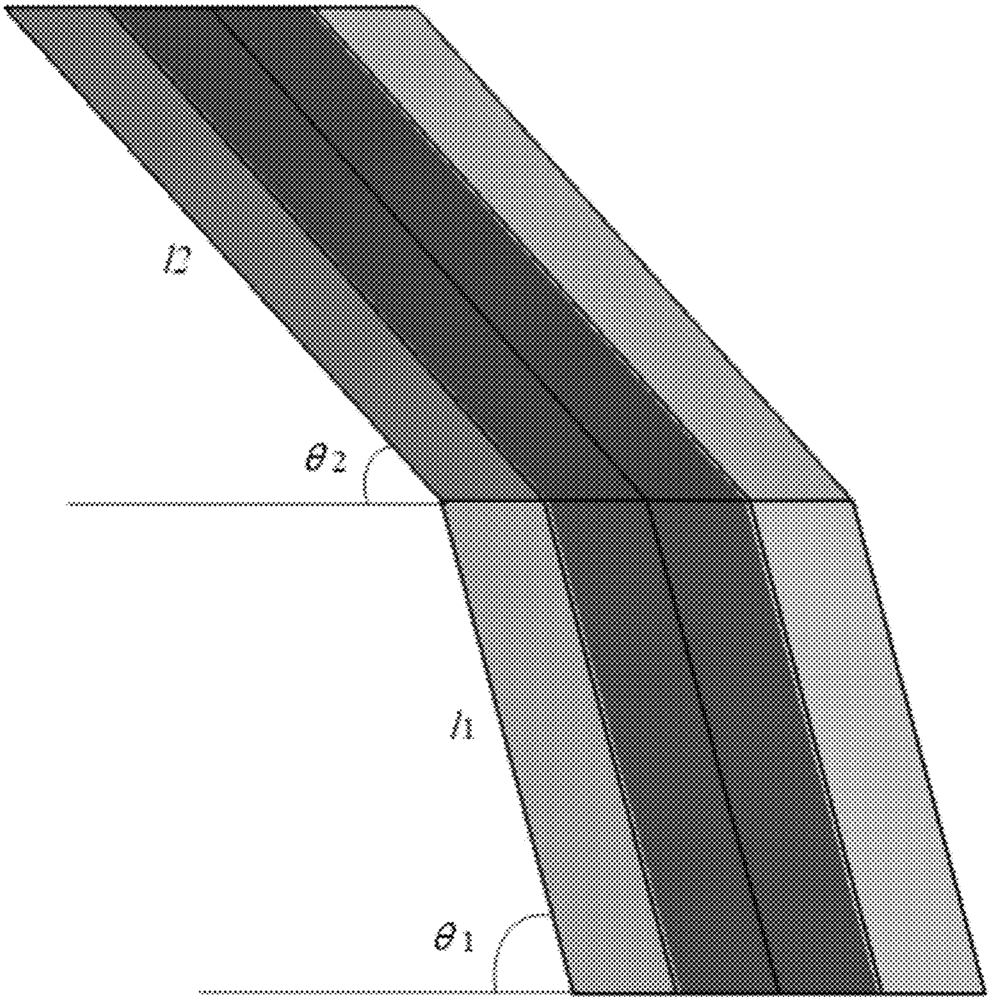
FIG. 4 is a schematic structural diagram of the rhombic inclined wedge supporting column 2 according to an embodiment of the disclosure.

The rhombic inclined wedge supporting column 2 includes multiple sections of rhombic inclined wedges, as shown in FIG. 4, that is, the supporting column is divided into n sections of rhombic inclined wedges by subsection design, with the same ground size, and the length of each section is $l_1, l_2, \ldots, l_n$ respectively. The calculation formula of length is:

$$l_i = l_0(1+\alpha\times i),\ i = 1, 2, \ldots, n;$$

where $l_0$ is the reference length and $\alpha$ is the adjustment coefficient of rhombic inclined wedge length. In this embodiment, $l_0=1.81\lambda$, $\alpha=0.414$.

The inclination angles of each section of inclined wedge supporting column and the horizontal surface are $\theta_1, \theta_2, \ldots, \theta_n$ respectively, and the calculation formula of inclination angle is:

$$\theta_i = \theta_0(1+\beta\times i),\ i = 1, 2, \ldots n;$$

where $\theta_0$ is the initial inclination and $\beta$ is the inclination adjustment coefficient. In this embodiment, $\theta_0=100°$, $\beta=-0.251$, and the subsection design makes the rhombic inclined wedge supporting column 2 show excellent scattering performance in different frequency bands.

The electromagnetic scattering characteristics of rhombic inclined wedge supporting column 2 are analyzed by electromagnetic simulation software, and the length and inclination parameters of each section are optimized to minimize the reflection coefficient of the supporting column in the target frequency band. Two factors should be considered comprehensively in the selection of inclination angle: considering the load target load, the angle between the supporting column and the turntable base should not be too small; considering the reflection of the supporting column, there should be a suitable angle to minimize the RCS of the supporting column. As an example, the test working frequency is 0.3-0.5 GHz, and the rhombic inclined wedge supporting column 2 is set to two sections. Through the optimization of electromagnetic simulation software, it is obtained that: $l_1=2.56\lambda$, $l_2=3.31\lambda$, $\theta_1=74.9°$, $\theta_2=49.8°$, $\lambda$ is the wavelength corresponding to the center frequency of the designed low frequency band.

Figure 5:
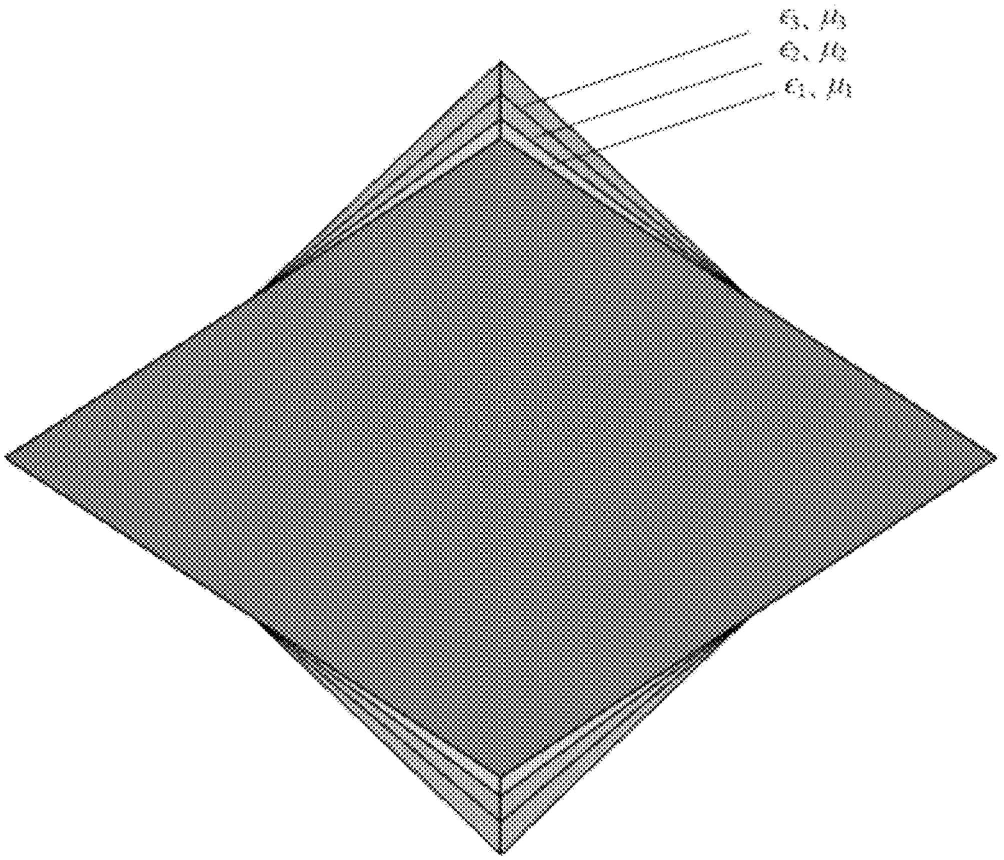
FIG. 5 is a schematic diagram of the layout of multi-layer wave-absorbing materials of rhombic inclined wedge supporting column 2 according to an embodiment of the disclosure.

The multi-layer wave-absorbing materials are arranged on the left and right sides of the rhombic inclined wedge supporting column 2. As shown in FIG. 5, the incident electromagnetic waves are gradually attenuated in each layer of materials by superimposing material layers with different characteristics, so as to achieve the wave-absorbing effect. The selection and arrangement order of each layer of materials determines the overall performance of wave-absorbing materials. The multi-layer wave-absorbing material consists of m layers of different materials. The thickness of each layer is $d_1, d_2, \ldots, d_m$, the dielectric constant is $\epsilon_1, \epsilon_2, \ldots, \epsilon_m$ and the permeability is $\mu_1, \mu_2, \ldots, \mu_m$, the total thickness is D. The distribution of multi-layer wave-absorbing materials adopts cosine distribution as follows:

$$d_j = d_0\left(\cos\left(\frac{\pi \times j}{2m}\right) + 1\right);$$

where $d_0$ is the initial thickness, m is the total number of layers and j is the j-th layer. In this embodiment, $d_0=10$ mm.

In this embodiment, m=3, the first layer of the multi-layer wave-absorbing material is LS layer (low scattering layer), $d_1=18.7$ mm, $\epsilon_1=12$, $\mu_1=4$, the second layer is carbon fiber layer, $d_2=15$ mm, $\epsilon_2=13$, $\mu_2=2$, and the third layer is MCS layer (magnetic composite shielding layer), $d_3=10$ mm, $\epsilon_3=8$, $\mu_3=2$. By stacking material layers with different characteristics, the incident electromagnetic wave is gradually attenuated in each layer of material, so as to achieve the wave absorption effect. In the above design, the combination of thickness, dielectric constant and permeability of each layer is carefully selected to ensure the best performance in the working frequency range.

In this embodiment, the bottom plate 3 is an oval bottom plate. In the existing turntable design, the bottom plate 3 usually adopts a circular structure, which has certain limitations in the reflection and scattering characteristics of electromagnetic waves. The circular bottom plate will lead to the uniform distribution reflection and scattering of electromagnetic waves, which can not effectively reduce electromagnetic interference and measurement error. Therefore, in this embodiment, the bottom plate 3 of the turntable adopts an oval bottom plate. By adjusting the ratio of the long axis a and the short axis b, the reflection and scattering paths of electromagnetic waves can be significantly optimized, and the performance of the turntable in different frequency bands can be improved, thus significantly improving the test accuracy of the quiet zone.

The design formula of oval bottom plate is:

$$\frac{x^2}{a^2} + \frac{y^2}{b^2} = 1;$$

where x and y are the values of horizontal and vertical coordinates in rectangular coordinate system.

The electromagnetic simulation software is used to simulate the combination of different long axis and short axis, and the electromagnetic wave reflection and scattering characteristics are analyzed. Through the simulation results, the long axis a and short axis b with the smallest reflection coefficient and scattering coefficient are found. As an example, long axis $a=2.07\lambda$ and short axis $b=1.33\lambda$.

The reason why adjusting the ratio of long axis to short axis can significantly reduce the measurement error is that the geometric characteristics of elliptical bottom plate make electromagnetic waves produce reflection and scattering paths different from those of circular bottom plate when they encounter elliptical bottom plate. The circular bottom plate will lead to the uniform reflection of electromagnetic waves and form strong back waves, while the elliptical bottom plate can disperse the reflection path of electromagnetic waves, thus reducing the back wave intensity and the overall reflection coefficient and scattering coefficient. By optimizing the ratio of long axis to short axis, the reflection path of electromagnetic wave can be dispersed to the maximum extent, the probability of electromagnetic wave directly reflecting back to the receiving antenna can be reduced, and the measurement accuracy can be improved.

Further, while adjusting the inclination angle of the supporting column 2, rectangular wave-absorbing materials should be arranged at the junction of the supporting column 2 and the bottom plate 3 to disperse the concentrated current, thus reducing the reflection, reducing the gap and truncating the caused current, and finally reducing the overall reflection level.

The oval bottom plate is vertically arranged above the longitudinal rotating shaft 6, and the longitudinal rotating shaft 6 is vertically arranged above the turntable base 4; The rhombic inclined wedge supporting column 2 is placed on the focus of the oval bottom plate; the fixed block 5 is arranged at the top of the rhombic inclined wedge supporting column 2.

The turntable includes a transverse rotating shaft 7 and a longitudinal rotating shaft 6, so that the turntable can rotate freely in the horizontal and vertical directions, and it is convenient to adjust the measuring angle. The transverse rotating shaft 7 can drive the L-shaped baffle 1, the rhombic inclined wedge supporting column 2, the bottom plate 3, etc. to rotate transversely by 360°, and the longitudinal rotating shaft 6 can drive the L-shaped baffle 1 to rotate longitudinally by 360°.

Another embodiment of the disclosure provides a quiet zone test method, which includes: using the low scattering turntable described in the above embodiment to perform the quiet zone test.

Specifically, the quiet zone test is carried out in the electromagnetic compatibility test laboratory to ensure that the influence of the environment on the measurement results is minimized. Use vector network analyzer, standard signal source, transmitting and receiving antennas and wave-absorbing materials. In order to verify the influence of the improved turntable on the quiet zone test performance, the effect of the optimized design is evaluated by comparing the differences in electromagnetic scattering characteristics between the traditional turntable and the improved turntable in the disclosure.

Firstly, the vector network analyzer and the standard signal source are calibrated, and the traditional turntable and the improved turntable are installed in the quiet zone test area respectively to ensure that the positions and environmental conditions of the two turntables are consistent. The target object is installed on the turntable to simulate the actual working state. Vector network analyzer is used to record the electromagnetic scattering characteristics of traditional turntable in the working frequency band, the phenomena of sharp wedge diffraction and traveling wave scattering are focused on, and the test results are saved as benchmark data. Then, an improved turntable with multi-section adjustable rhombic inclined wedge supporting columns and multi-layer side wave-absorbing material layout is installed, and the electromagnetic scattering characteristics of the improved turntable in the same frequency band are recorded by using the same measurement method, the performance of the combination of multi-section rhombic supporting columns and wave-absorbing materials in reducing sharp wedge diffraction and traveling wave scattering is focused on.

The two groups of measured data are compared in data processing software. By comparing the electromagnetic scattering characteristics between the traditional turntable and the improved turntable, especially the difference of reflection level and scattering intensity, the effect of the improved turntable in reducing electromagnetic interference, reducing measurement error and improving quiet zone performance is quantified.

According to the test results, the turntable designed by the disclosure adjusts the thickness and arrangement order of multi-layer wave-absorbing materials, optimizes the inclination angle and the section number of supporting columns, and improves the wave-absorbing effect and structural stability. Further testing ensures that the optimized turntable shows better performance in a wider frequency band. The design and optimization of multi-layer wave-absorbing materials can be analyzed by transfer matrix method. The electromagnetic characteristics of each layer of materials are expressed in matrix form by transfer matrix method, and the reflection and transmission characteristics of the whole multi-layer structure are obtained by matrix operation. The goal of the transfer matrix method is to calculate the total transfer matrix $T_{total}$ of the whole structure through the transfer matrix of each layer, and then the total transfer matrix $T_{total}$ is used to solve the reflection coefficient and transmission coefficient.

Where the total transmission matrix $T_{total}$ is the product of the transmission matrix Tj of each layer:

$$T_{total} = T_1 \times T_2 \times T_3 \times \ldots \times T_m = \begin{pmatrix} A & B \\ C & D \end{pmatrix};$$

where, A, B, C, D are transmission parameters of the total transmission matrix $T_{total}$. Where, for the j-th layer of multi-layer wave-absorbing materials, the transmission matrix Tj is expressed as:

$$T_j = \begin{pmatrix} \cos(k_j d_j) & -j\sin(k_j d_j)/\eta_j \\ -j\sin(k_j d_j)/\eta_j & \cos(k_j d_j) \end{pmatrix};$$

where, $k_j$ is the wave number of the j-th layer material and $\eta_j$ is the characteristic impedance; $d_j$ the thickness of the j-layer material.

The reflection coefficient R represents the reflection intensity of the incident wave at the interface of the material structure, and the reflection coefficient R can be calculated by the following formula:

$$R = \frac{A + B\eta_{out} - C/\eta_{in} - D}{A + B\eta_{out} + C/\eta_{in} + D};$$

where, $\eta_{in}$ and $\eta_{out}$ are the characteristic impedances of the incident medium and the emergent medium, respectively.

The transmission coefficient T represents the transmission intensity of the incident wave after passing through the material structure, and the transmission coefficient T can be calculated by the following formula:

$$R = \frac{2(\eta_{in}\eta_{out})^{1/2}}{A + B\eta_{out} + C/\eta_{in} + D};$$

The reflection coefficient R and transmission coefficient T are calculated by the transfer matrix method, and the thickness, dielectric constant and magnetic permeability of each layer material of the multi-layer wave-absorbing materials arranged on the left and right sides of the rhombic inclined wedge supporting column 2 are adjusted according to the wave-absorbing requirements of the target frequency band, so that the best wave-absorbing effect can be achieved. It can be seen from the test results that the whole reflection electric level can be further reduced by setting multiple layers of wave-absorbing materials on the side of the supporting column.

Through the above process, the optimization effect of the improved turntable on electromagnetic scattering characteristics is comprehensively evaluated. The test results show that the turntable with multi-section adjustable rhombic inclined wedge supporting columns and multi-layer side wave-absorbing materials layout significantly reduces the reflection and scattering of electromagnetic waves in the working frequency band, and improves the test accuracy and stability of the quiet zone. This result provides strong data support for the further optimization and practical application of the turntable.

Figure 6:
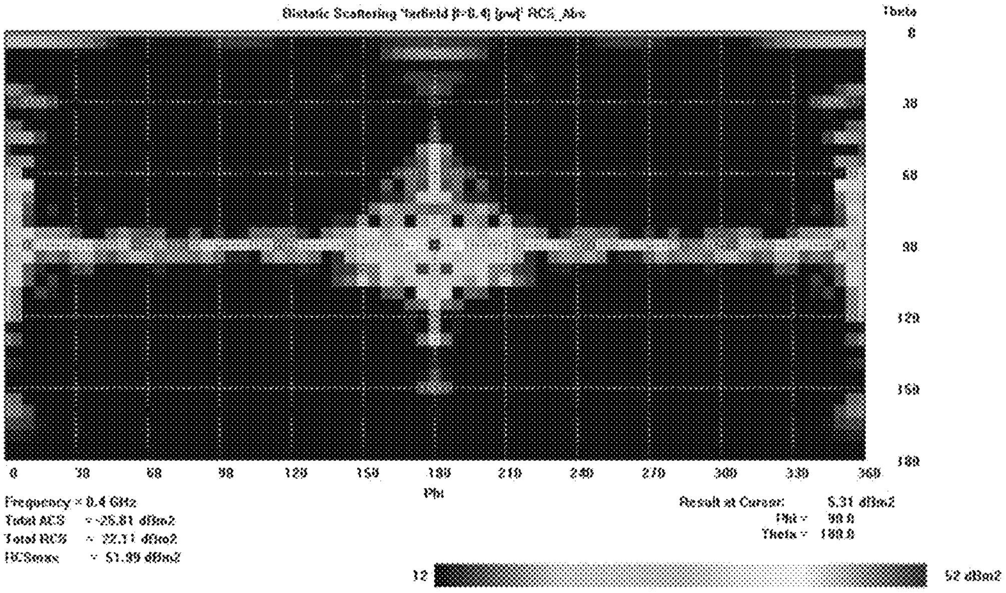
FIG. 6 is an example diagram of the result of the RCS of the conventional turntable in the 2D plan view according to an embodiment of the disclosure.
Figure 7:
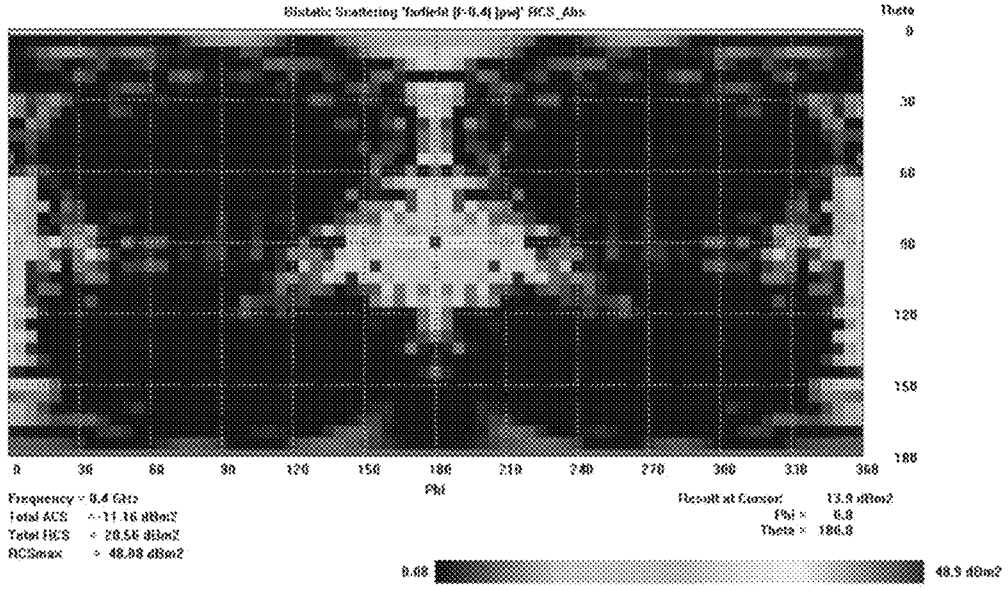
FIG. 7 is an example diagram of the result of RCS of the improved low scattering turntable in 2D plan view according to an embodiment of the disclosure.
Figure 8:
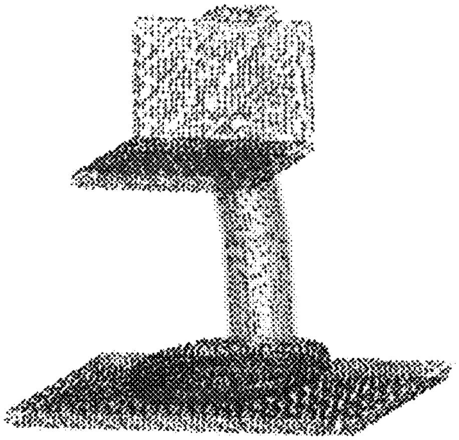
FIG. 8 is an example diagram of current distribution on the surface of the improved low scattering turntable in the quiet zone test according to an embodiment of the disclosure.

As shown in FIG. 6 to FIG. 8, the differences in electromagnetic scattering characteristics between the traditional turntable and the improved turntable are compared, and the effect of the optimized design is evaluated. According to the test images, the RCS of the optimized turntable is reduced, which shows that the electromagnetic interference is reduced and the measurement accuracy is improved. The current on the surface of the rhombic inclined wedge becomes smaller and looser, and the current at the junction with the wave-absorbing material also becomes smaller, so the overall reflection of the turntable is smaller.

It should be noted that the terminology used in the disclosure is only for describing specific embodiments, and is not intended to limit the scope of this disclosure. As shown in the specification of the disclosure, unless the context clearly indicates an exception, the words "a", "an", "one" and/or "the" do not refer to the singular, but may also include the plural. The terms "including", "including" or any other variation thereof are intended to cover non-exclusive inclusion, so that a process, method or device including a series of elements includes not only those elements, but also other elements not explicitly listed or elements inherent to such process, method or device. Without more restrictions, the element defined by the sentence "including one" does not exclude that there are other identical elements in the process, method or device including the element.

It should also be noted that the orientation or positional relationship indicated by the terms "center", "upper", "lower", "left", "right", "vertical", "horizontal", "inner" and "outer" is the orientation or position relationship based on the attached drawings, which is only for the convenience of describing the disclosure and simplifying the description, and does not indicate or imply that the referred device or element must have a specific orientation, be constructed and operate in a specific orientation, and therefore should not be construed as limiting the disclosure. Unless otherwise specified and limited, the terms "installation", "connection" and "connect" should be broadly understood, for example, they can be fixed connection, can also be detachable connection or integrated connection. It can be a mechanical connection, can also be an electrical connection; can be directly connected, can also be indirectly connected through an intermediate medium, and can be connected inside two elements. For those skilled in the art, the specific meanings of the above terms in the disclosure can be understood in specific situations.

Finally, it should be explained that the above embodiments are only used to illustrate the technical scheme of the disclosure, but not to limit it. Although the disclosure has been described in detail with reference to the foregoing embodiments, it should be understood by those skilled in the art that the technical scheme described in the foregoing embodiments can still be modified, or some or all of its technical features can be replaced by equivalents. However, these modifications or substitutions do not make the essence of the corresponding technical solutions deviate from the technical solutions of various embodiments of the disclosure.

What is claimed is:

1. A low scattering turntable for improving quiet zone test performance, comprising an L-shaped baffle, a rhombic inclined wedge supporting column, a bottom plate, a turntable base, a fixed block, a longitudinal rotating shaft and a transverse rotating shaft; wherein, a bottom plate outer edge of the L-shaped baffle is provided with sawtooth wave-absorbing material; a height $h_z(x)$ of each sawtooth in the sawtooth wave-absorbing material at different horizontal positions is expressed as:

$$h_z(x) = A_z\left|\frac{2}{\pi}\arctan\left(\tan\left(\frac{\pi x}{\lambda}\right)\right)\right|;$$

wherein $A_Z$ represents an amplitude of the sawtooth; x represents a horizontal position of the sawtooth; $\lambda$ represents a wavelength corresponding to a center frequency of a designed frequency band;

a bottom end of the rhombic inclined wedge supporting column is fixedly placed on the bottom plate, and a top end is fixedly connected with the fixed block; multi-layer wave-absorbing materials are arranged on a left side and a right side of the rhombic inclined wedge supporting column;

a side surface of the fixed block is movably connected with the transverse rotating shaft, the transverse rotating shaft is movably connected with a side surface of the L-shaped baffle and the transverse rotating shaft drives the L-shaped baffle to rotate longitudinally by 360°;

the longitudinal rotating shaft is movably connected below the bottom plate, the longitudinal rotating shaft is movably connected with the turntable base, the longitudinal rotating shaft drives the bottom plate and above components to rotate transversely by 360°.

2. The low scattering turntable for improving quiet zone test performance according to claim 1, wherein the sawtooth wave-absorbing material adopts a magnetic composite shielding layer.

3. The low scattering turntable for improving quiet zone test performance according to claim 1, wherein the rhombic inclined wedge supporting column comprises a plurality of sections of rhombic inclined wedges, and a calculation formula of a length $l_i$ of each of sections is:

$$l_i = l_0(1 + \alpha \times i)$$

wherein $l_0$ is a reference length and $\alpha$ is a length adjustment coefficient; i=1, 2, . . . , n, n is a total number of sections; a calculation formula of an included angle $\theta i$ between each of sections and a horizontal surface is:

$$\theta_i = \theta_0(1 + \beta \times i)$$

wherein $\theta_0$ is an initial inclination angle, and $\beta$ is an angle adjustment coefficient.

4. The low scattering turntable for improving quiet zone test performance according to claim 1, wherein thickness, dielectric constant and magnetic permeability of each layer wave-absorbing material of each of the multi-layer wave-absorbing materials are different; wherein a calculation formula of thickness of each layer wave-absorbing material is:

$$d_j = d_0\left(\cos\left(\frac{\pi \times j}{2m}\right) + 1\right)$$

wherein $d_0$ is an initial thickness, m is a total number of layers, and j is a j-th layer.

5. The low scattering turntable for improving quiet zone test performance according to claim 4, wherein a total number of layers each of the multi-layer wave-absorbing materials is three, wherein the first layer adopts a low scattering layer, the second layer adopts a carbon fiber layer, and the third layer adopts a magnetic composite shielding layer.

6. The low scattering turntable for improving quiet zone test performance according to claim 1, wherein the bottom plate is an oval bottom plate, and lengths of a long axis and a short axis of the oval bottom plate is obtained by electromagnetic simulation software, and a value of each of the lengths is multiple of the wavelength corresponding to the center frequency of the designed frequency band, and a reflection coefficient and scattering coefficient of the bottom plate are minimized.

7. The low scattering turntable for improving quiet zone test performance according to claim 6, wherein the bottom end of the rhombic inclined wedge supporting column is fixedly placed on a focus of the bottom plate.

8. A quiet zone test method, wherein the quiet zone test is performed by using the low scattering turntable for improving the quiet zone test performance according to claim 1.

* * * * *